(12) United States Patent
Janke et al.

(10) Patent No.: US 7,874,491 B2
(45) Date of Patent: Jan. 25, 2011

(54) CARRIER ARRANGEMENT WITH OVERVOLTAGE PROTECTION

(75) Inventors: Marcus Janke, Munich (DE); Peter Laackmann, Munich (DE)

(73) Assignee: Infineon Technologies AG (DE)

( * ) Notice: Subject to any disclaimer, the term of this patent is extended or adjusted under 35 U.S.C. 154(b) by 964 days.

(21) Appl. No.: 11/696,984

(22) Filed: Apr. 5, 2007

(65) Prior Publication Data

US 2007/0235547 A1  Oct. 11, 2007

(30) Foreign Application Priority Data

Apr. 7, 2006 (DE) .................. 10 2006 016 419

(51) Int. Cl.
*G06K 19/06* (2006.01)
(52) U.S. Cl. .................. 235/492; 361/737
(58) Field of Classification Search .......... 235/492; 361/737, 764
See application file for complete search history.

(56) References Cited

U.S. PATENT DOCUMENTS

| | | | |
|---|---|---|---|
| 4,617,605 A * | 10/1986 | Obrecht et al. .............. | 361/220 |
| 5,714,794 A | 2/1998 | Tsuyama et al. | |
| 6,370,029 B1 * | 4/2002 | Kawan .................. | 361/737 |
| 2005/0063118 A1 * | 3/2005 | Durth et al. .............. | 361/91.1 |
| 2005/0174716 A1 * | 8/2005 | Domejean et al. .......... | 361/118 |
| 2007/0216015 A1 * | 9/2007 | Schnitt et al. ............. | 257/692 |
| 2007/0223171 A1 * | 9/2007 | Guy et al. ................. | 361/126 |

FOREIGN PATENT DOCUMENTS

| | | |
|---|---|---|
| DE | 31 30 324 | 2/1983 |
| DE | 43 29 251 | 3/1995 |
| DE | 196 15 395 | 10/1996 |
| DE | 100 65 019 | 8/2001 |
| DE | 10 2004 043 408 | 4/2005 |
| EP | 0 211 517 | 7/1986 |

* cited by examiner

*Primary Examiner*—Ahshik Kim
(74) *Attorney, Agent, or Firm*—Dickstein Shapiro LLP

(57) ABSTRACT

A carrier arrangement having a carrier configured to fix a semiconductor chip, contacts located on the carrier and configured to make contact with the semiconductor chip, and an overvoltage protection in a form of a spark gap arrangement formed between the contacts.

22 Claims, 4 Drawing Sheets

CARRIER ARRANGEMENT WITH OVERVOLTAGE PROTECTION

CROSS REFERENCE TO RELATED APPLICATION

This application claims priority to German Patent Application Serial No. 10 2006 016 419.9 which was filed Apr. 7, 2006, and is incorporated herein by reference in its entirety.

BACKGROUND

Carrier arrangement and smart card comprising overvoltage protection device.

Electrostatic voltages arise whenever the number of positive charge carriers in a body does not match the number of negative charge carriers. If the voltage difference is large enough, then an electric current pulse can flow between two bodies even via a normally electrically insulating material. This is referred to as an electrostatic discharge. Electrostatic voltages and electrostatic discharges, due to the high electric field strengths and current pulses associated with them, can lead to the destruction of electrical components. Particularly in integrated circuits, electrostatic discharge constitutes one of the commonest causes of failure since the insulators used therein, such as silicon dioxide, for example, can easily be damaged on account of their small dimensions. In smart card modules, security controllers have to be protected against electrostatic discharge according to ISO standards.

In order to afford protection against electrostatic overvoltages and discharges, it is possible to overdimension electrical components in the smart card modules or carrier arrangements to increase their dielectric and breakdown strength.

Spark gap arrangements are another type of overvoltage protection. Such an arrangement between, for example, contacts for which an overvoltage is intended to be avoided, enables a controlled electrostatic discharge. In this case, the spark gap arrangement is configured in such a way that the spark discharge takes place at e.g. lower voltages in the spark gap arrangement, than at other locations of the smart card module. During the discharge, therefore, the current pulse flows through the spark gap arrangement and not through sensitive electrical components. The use of a spark gap arrangement for smart card modules is virtually free of perturbing reactions, simple in terms of construction and multiply usable. Furthermore, a spark gap arrangement does not consume any additional current consumption and obviates the need for overdimensioning of components.

BRIEF DESCRIPTION OF THE DRAWINGS

The invention is explained below on the basis of exemplary embodiments with reference to the drawing, wherein identical or identically acting component parts are in each case depicted with the same reference symbols in the figures. The elements illustrated should not be regarded as true to scale, rather individual elements may be illustrated with an exaggerated size or with exaggerated simplification in order to afford a better understanding.

DESCRIPTION OF THE INVENTION

Figure 1:
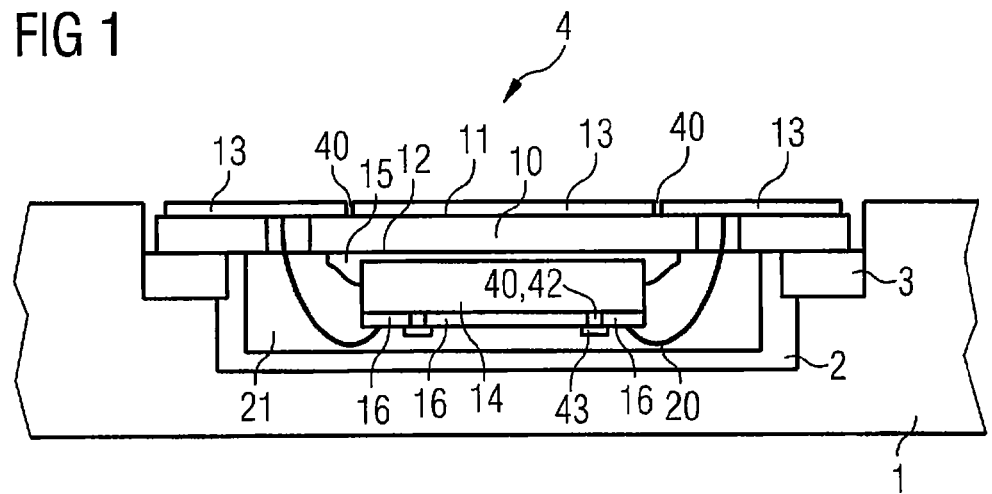
FIG. 1 shows an excerpt from a cross section through an exemplary embodiment of a wire-bonded smart card module according to the invention.

FIG. 1 shows parts of a cross section through an exemplary embodiment of a smart card with contacts with a wire-bonded smart card module 4. A cavity 2 is introduced in a smart card body 1, a smart card module 4 being fixed in the cavity by means of an adhesive 3. The smart card module 4 comprises a carrier 10 having a contact area side 11 and an opposite chip side 12. Contact areas 13 are applied on the contact area side 11. A semiconductor chip 14 is fixed on the second carrier side 12 by means of chip adhesive 15. The chip connection areas 16 of the chip 14 are connected to the contact areas 13 via bonding wires 20. In order to afford protection against damage, the bonding wires 20 and the semiconductor chip 14 are encapsulated with a potting composition 21. The smart card module 4 has contacts which are formed as contact areas 13 and/or as chip connection areas 16 and between which spark gap arrangements 40 are formed.

Each semiconductor chip has chip connection areas for connection by means of bonding wires or solder bumps. The chip connection areas are formed on the herein after active side of the chip substrate. The chip connection areas are shaped for example in such a way that at least one spark gap arrangement is formed between the individual chip connection areas that are to be protected against overvoltage and electrostatic discharge. An overvoltage is discharged by the spark gap arrangements, with the result that the semiconductor chip is protected against overvoltages.

It is conceivable to provide the spark gap arrangement with spark gap coverings. The spark gap coverings ensure that the spark gap arrangements are not filled with potting composition in the case of wire-bonded smart card modules and are not filled with chip adhesive in the case of flip-chip smart card modules. In both cases, no spark discharge would take place. The spark gap covering ensures that a suitable discharge medium is present in the spark gap arrangement. The spark gap covering may also be embodied as an encapsulation of the spark gap arrangement.

Figure 2:
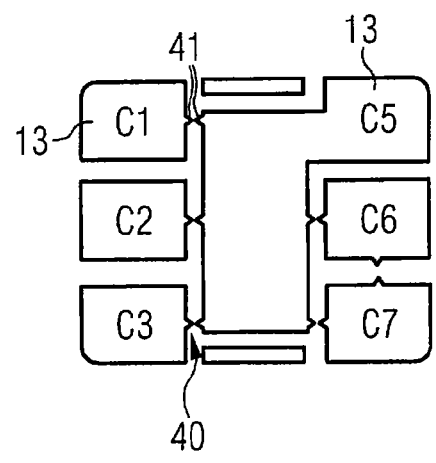
FIG. 2 shows an exemplary embodiment of the contact areas according to the invention.

FIG. 2 shows an exemplary embodiment of the contact areas 13 according to the invention as they appear in a plan view of FIG. 1. An embodiment with six contacts dimensioned in accordance with the ISO-7816 standard is shown. The contacts C1 to C3 carry the signals VCC, RST and CLK and the contacts C5 to C7 carry the signals GND, VPP and I/O. According to the invention, spark gap arrangements 40 are provided for protection against overvoltages between the contact areas 13. In this case, the earth contact C5 is embodied in large-area fashion and all the other contacts have a spark gap arrangement 40 with respect to the contact. Spark gap arrangements may, however, also be formed between two adjacent contact areas, such as for example between the contacts C6 and C7, and need not necessarily be present between all the contacts.

If the spark gap arrangements are formed as contact area parts, they can be produced from the same material as the contact areas as well. Then they can be realized in the same production step.

The spark gap arrangement may have spark gap elements which are arranged between the contact areas and are electrically connected to the contact areas. As a result, the spark discharge takes place via separate spark gap elements. The spark gap elements can thereby be produced from a material which is particularly suitable for spark discharges, for example is characterized by little erosion. The spark gap elements are then embodied separately from the contact areas, but are electrically connected thereto.

The spark gap arrangements 40 comprise two spark gap elements 41 which are arranged opposite one another and which are embodied in pointed fashion. A concentration of the electric field energy takes place at the tips, so that an electrical discharge preferably takes place between the tip of one spark gap element 41 and the opposite tip of another spark gap element 41. The voltage, at which a spark jumps over between the tips and thereby an electrostatic discharge takes place via the spark gap arrangement 40, can be set up by way of the distance between the spark gap elements 41 and the form of the spark gap elements 41, and also the discharge medium. The discharge voltages between different contacts can be chosen differently, depending on the sensitivity of the components connected thereto. The distances between the spark gap elements 41 can be produced with high precision by means of a laser even in the case of very small distances. The predetermined distance and the form of the spark gap elements 41 are chosen such that a direct electrical contact is reliably precluded and a spark discharge takes place when a predetermined voltage value is exceeded. A voltage between two contact areas 13 between which a spark gap arrangement 40 exists cannot exceed a predetermined voltage value. So the smart card module 4 is protected against overvoltage. The spark gap elements 41 may be formed in triangular, finger-shaped, circular or comb-like fashion. Metals having a low electrical resistance and a high thermal conductivity, e.g. as copper and silver are particularly suitable for the spark gap elements 41. In the case of smart cards, the material of which the contact areas 13 is composed is already chosen such that it has good capability in respect of corrosion and resistance to wear, so that it is also suitable for the spark gap elements 41 and the latter can be produced together with the contact areas 13. Alternatively the spark gap elements 41 can be applied by vapour deposition, printed on or produced by photolithography and be electrically connected to the contact areas 13.

Figure 3:
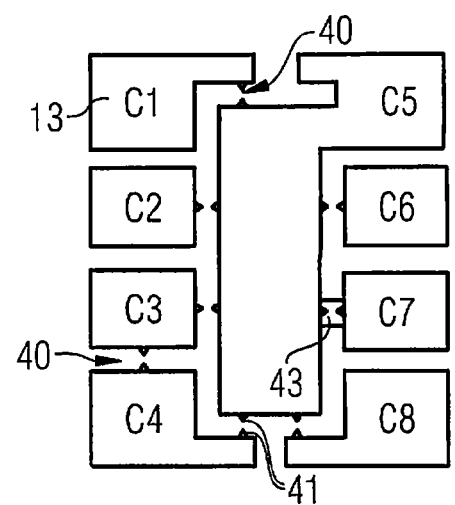
FIG. 3 shows a further exemplary embodiment of the contact areas according to the invention.

FIG. 3 shows a further exemplary embodiment of the contact areas 13 according to the invention, this time in an embodiment in accordance with ISO 7816 with eight contacts C1 to C8. Again at least one spark gap arrangement 40 is provided between the earth contact C5 and the further contacts C1 to C4 and C6 to C8. The number of spark gap arrangements 40 can be varied, with the result that, by way of example, not all the contact areas 13 have a spark gap arrangement 40 with respect to the earth contact C5 or the contact areas 13 have further spark gap arrangements 40 among one another. The explanations given with regard to FIG. 2 again hold true for the spark gap elements 41 and the spark gap arrangement 40.

In order to avoid the situation where the spark gap arrangements 40 are congested due to soiling or depositing of conductive particles of the contact pins of readers and short circuits between the contact areas 13 occur due to the spark gap arrangements 40 or the spark discharge at a predetermined voltage can no longer be guaranteed, it is possible to cover the spark gap arrangements 40.

The spark gap elements may be thinner than the contact areas and the spark gap arrangements are possibly covered in the region of the spark gap elements.

In particular spark gap elements 41 which are thinner than the contact areas 13 can be protected by a non-conductive covering or encapsulation 43 between the contact areas 13. The covering 43 is embodied in such a way that it terminates level and flush with the contact areas 13; it may also be embodied such that the spark gap arrangement 40 is hermetically tightly encapsulated.

Figure 4:
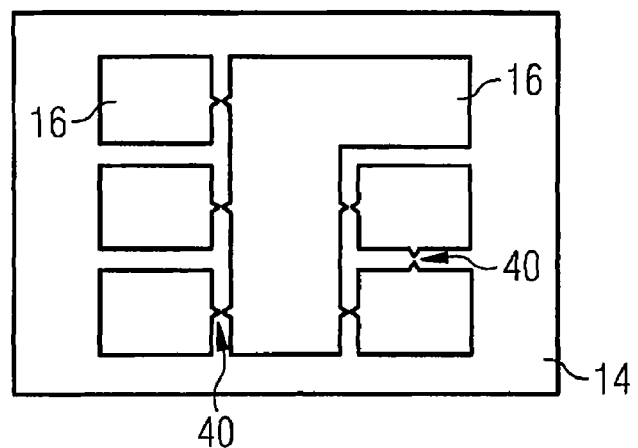
FIG. 4 shows an exemplary embodiment of the chip connection areas according to the invention.

FIG. 4 shows an exemplary embodiment of the chip connection areas 16 according to the invention with spark gap arrangements 40. The chip connection areas 16 are situated on the active side of the semiconductor chip 14 and serve for connecting the electrical contacts of the semiconductor chip 14. In FIG. 1, the bonding wires 20 are bonded onto the chip connection areas 16, and in FIG. 5, solder bumps 32 are positioned on the chip connection areas 16. The chip connection areas 16 are shown for a chip module variant with six contacts, as in FIG. 2, variants with a different number of contacts also being possible. Spark gap arrangements 40 are arranged between the individual chip connection areas 16. The explanations provided in respect of the spark gap arrangements 40 in FIGS. 2 and 3 once again hold true, with the difference that the chip connection areas 16 rather than the contact areas 13 are involved.

By virtue of the fact, that the arrangement of spark gap arrangements 40 is between the chip connection areas 16, the chip connection areas 16 are in a horizontal position in the interior of the smart card module 4 and protected against soiling and depositing. In order to enable a spark discharge, however, it is necessary that the spark gap arrangements 40 are not filled with the potting composition 21, rather that a suitable discharge medium such as, for example, air or some other ionizable gas is present between the spark gap arrangements 40. This could be achieved for example by means of a covering or encapsulation 43 of the chip connection areas 16 in the region of the spark gap arrangements 40 prior to potting with the molder compound 21, so that a spark gap cavity 42 arises as is shown in FIG. 1. If the spark gap cavity 42 is hermetically sealed, then that is advantageous since the moisture and hence the discharge voltage remain constant. The spark gap arrangements 40 arranged between the chip connection areas 16 can be used particularly advantageously in contactless smart cards since, in the case of the latter, it is not possible to realize spark gap arrangements 40 between contact areas 13. As an alternative, in the case of contactless smart cards, the coupling element connections required for operating the semiconductor chip may be formed in such a way that they form at least one spark gap arrangement 40 among one another. The coupling element may be for example an antenna formed in a smart card body. It is furthermore possible to form the spark gap arrangements between individual conductor tracks of the antenna in the smart card body.

Figure 5:
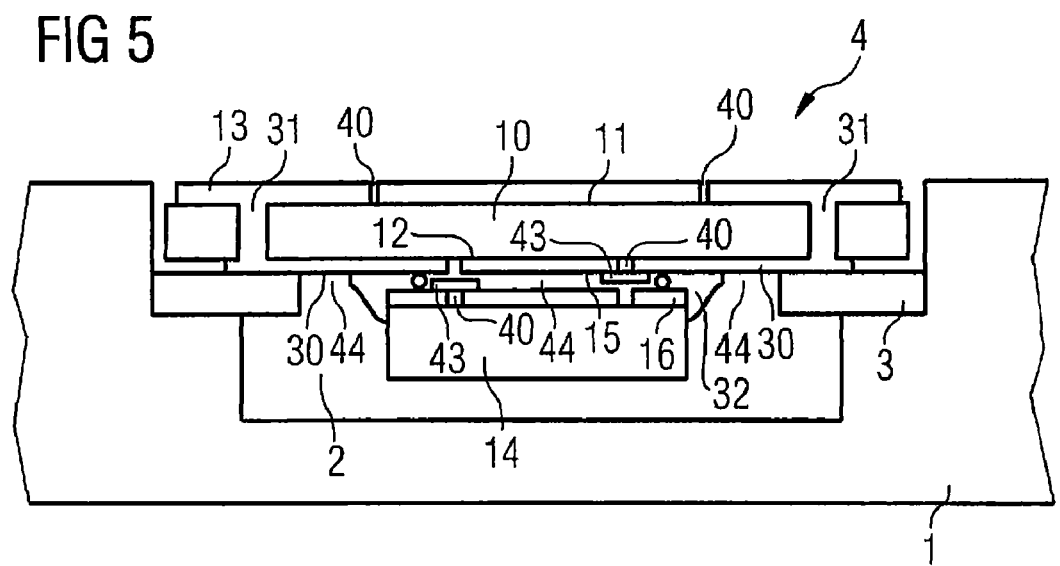
FIG. 5 shows an excerpt from a cross section through an exemplary embodiment of a flip-chip smart card module according to the invention.

FIG. 5 shows an excerpt from a cross section through an exemplary embodiment of a smart card with a flip-chip smart card module. This smart card module 4 differs from the smart card module 4 shown in FIG. 1 by virtue of the fact that conductor structures 30 are applied on the second carrier side 12, the conductor structures being connected to the contact areas 13 via plated-through holes 31 arranged in the carrier 10. A semiconductor chip 14 with chip connection areas 16 is furthermore mounted by flip-chip technology on a second carrier side 12. The semiconductor chip 14 is positioned in such a way that the chip connection areas 16 face the chip side 12. The chip connection areas 16 are connected to opposite conductor structures 30 by means of solder bumps 32. The semiconductor chip 14 is fixed by means of an adhesive 15 applied between the semiconductor chip 14 and the chip side 12. The smart card module 4 is once again introduced into a cavity 2 of a card body 1 and fixed by means of an adhesive 3. In contrast to the exemplary embodiment shown in FIG. 1, no bonding wires 20 and potting composition 21 are necessary, with the result that this arrangement is more compact. In the case of the exemplary embodiment shown in FIG. 5, it is possible to arrange spark gap arrangements 40 between the contacts of the smart card module, which are formed as contact areas 13, plated-through holes 31, conductor structures 30, and chip connection areas 16.

In this case, the carrier of the smart card module serves for fixing the contact areas and the chip.

The conductor structures are electrically connected to the contact areas via plated-through holes. The conductor structures are furthermore connected to the chip connection areas of the chip.

The chip connection areas of the chip are connected via the conductor structures and are electrically connected to the contact areas via the plated-through holes which are arranged in the carrier and reach from the contact area side to the chip side. The semiconductor chip is situated such that its chip connection areas lie opposite the chip side. This flip-chip technology enables higher packing densities since an encapsulation of the chip and the bonding wires by a potting composition is not required.

Apart from between the contact areas and the chip connection areas, the spark gap arrangements can also be realized in the conductor structures in order to protect the chip module against overvoltages. In this case, the conductor structures are applied over the area on the carrier and can be configured correspondingly such that a spark discharge preferably takes place between the conductor structures.

If the spark gap arrangement is realized between conductor structures, then it has to be ensured that it is free of materials, such as chip adhesive, for example, which would prevent a spark discharge. This is ensured by means of a spark gap cavity which is filled with a suitable discharge medium and which can be realized by means of a covering or encapsulation of the conductor structures in the region of the spark gap arrangements.

As an alternative to a spark gap cavity, the chip adhesive can be distributed in such a way that there is no chip adhesive, which would influence the discharge, in the conductor structure region of the spark gap arrangement. In this case, the spark gap arrangement and the region free of chip adhesive may lie between the semiconductor chip and the chip side or else outside the semiconductor substrate and the adhesive-bonding region.

Figure 6:
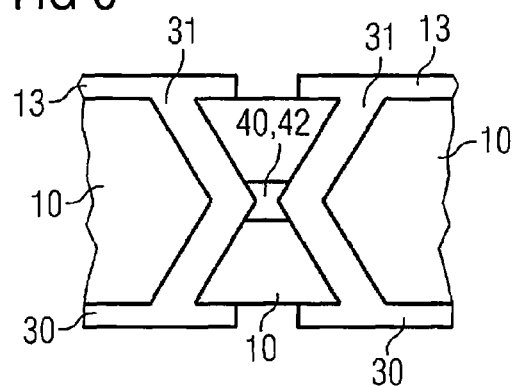
FIG. 6 shows an exemplary embodiment of the plated-through holes according to the invention.

FIG. 6 shows an excerpt from a cross section through two contact areas 13, the carrier 10 and two conductor structures 30, each contact area 13 being electrically connected to a conductor structure 30 via a respective plated-through hole 31. The spark gap arrangement 40 arranged between the plated-through holes 31 discharges overvoltages between the two contact areas 13, or the two conductor structures 30. In this case, the plated-through holes 31 are inclined towards one another in such a way that regions having high electric field strengths are directly opposite one another.

In one development, there may be present in the carrier spark gap elements which are in each case electrically connected to a contact area or a conductor structure and form a spark gap arrangement between a respective contact area and a respective conductor structure.

The spark gap elements constitute a parallel path for electrostatic discharges between a contact area and a conductor structure, the respective contact area and conductor structure not being electrically connected to one another via a plated-through hole.

Figure 7:
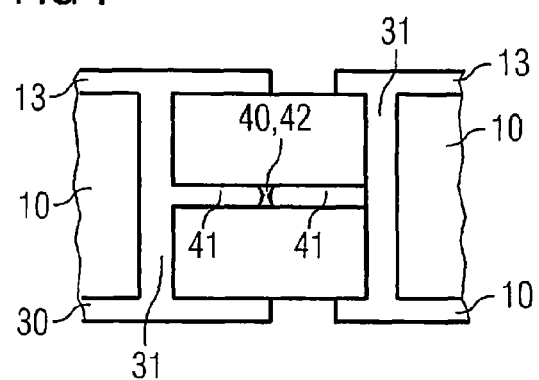
FIG. 7 shows a further exemplary embodiment of the plated-through holes according to the invention.

FIG. 7 shows a further exemplary embodiment of the plated-through holes 31 used to realize a spark gap arrangement 40. In this case, the plated-through holes 31 have spark gap elements 41 which are formed as projections and are electrically conductively connected to the plated-through holes 31.

Figure 8:
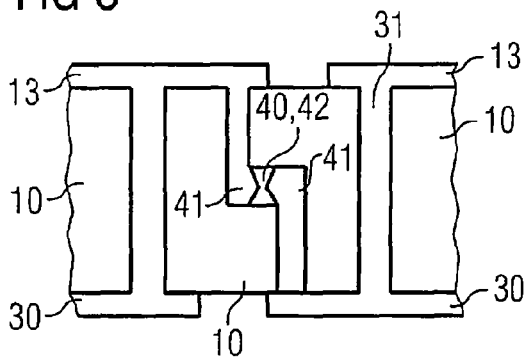
FIG. 8 shows an exemplary embodiment of the spark gap elements according to the invention.

FIG. 8 shows a further exemplary embodiment, in which the spark gap arrangement 40 is once again arranged in the carrier 10. In contrast to FIGS. 6 and 7, the spark gap elements 41 are not electrically connected to two plated-through holes 31, but rather to in each case a contact area 13 and a conductor structure 30.

Figure 9:
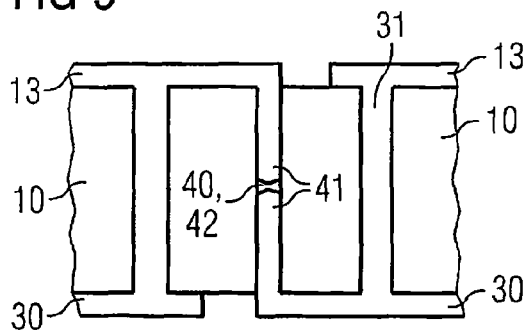
FIG. 9 shows a further exemplary embodiment of the spark gap elements according to the invention.

FIG. 9 shows a further exemplary embodiment, which is similar to that shown in FIG. 8 and in which the spark gap arrangement 40 is arranged in the carrier 10. In contrast to FIG. 8, the spark discharge takes place in the vertical direction.

The spark gap arrangement 40 is arranged in the carrier 10 in FIGS. 6 to 9. In order to enable a spark discharge along the spark gap arrangement 40, a discharge medium, for example an ionizable gas such as air, must be present. For this purpose, spark gap cavities 42 are provided in the carrier 10 in FIGS. 6 to 9, the spark gap cavities being filled with the discharge medium. An advantage of positioning spark gap arrangements 40 in the carrier 10 is that they are protected against environmental influences and soiling.

Figure 10:
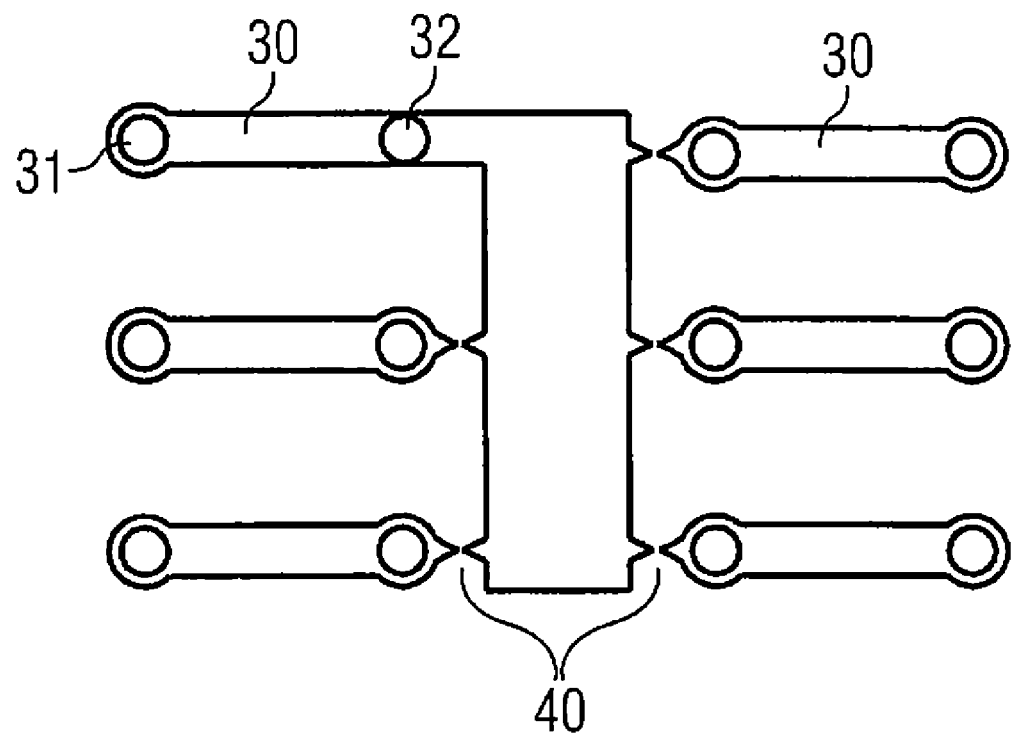
FIG. 10 shows an exemplary embodiment of the conductor structures according to the invention.

FIG. 10 shows an exemplary embodiment in which the spark gap arrangement 40 is formed between the conductor structures 30. The conductor structures 30 serve for connecting the plated-through holes 31 to the chip connection areas 16 via the solder bumps 32 and are embodied in such a way that they take account of the arrangement of the plated-through holes 31 and the chip connection areas 16. The spark gap arrangements 40 are once again formed between the grounded area, which is embodied in large-area fashion, and the other conductor structures 30. Spark gap arrangements 40 may also be arranged between individual conductor structures 30. In order to enable a spark discharge, it is necessary that the conductor structures 30 not be covered over with chip adhesive 15 at least in the region of the spark gap arrangement 40. In FIG. 5, this might be for example in the region 44 between the adhesive 3 and the chip adhesive 15 in which the conductor structures 30 are free of chip adhesive 15 and adhesive 3. As an alternative, the chip adhesive 15 could be applied in annular fashion, so that a region which is free of chip adhesive 15 and in which the spark gap arrangements 40 lie arises below the semiconductor chip 14. It is also possible to protect the spark gap arrangements 40 against the chip adhesive 15 by means of a covering or encapsulation 43.

The spark gap arrangements 40 between the contact areas 13, between the plated-through holes 31, between the contact areas 13 and the plated-through holes 31, between the conductor structures 30 and between the chip connection areas 16 can be combined with one another. A smart card module 4 of this type can then be adhesively bonded into a card body 1 and be used as a smart card. The invention is suitable not only for smart cards with contacts but also for contactless smart cards, the spark gap arrangements 40 then preferably being formed between the conductor structures 30 or the chip connection areas 16. The contactless smart card is then protected against overvoltages induced for example by an excessively high electromagnetic field strength in the corresponding coupling elements. In the case of smart cards with contacts, the contact areas of the smart card module serve for producing a contact with a terminal or smart card read and/or write unit. In this case, the contact areas form the interface between the smart card module and the outside world. According to the invention, spark gap arrangements are realized between the contact areas, with the result that an overvoltage transferred to one of the contacts by the terminal or a human is discharged at the corresponding spark gap arrangement, with the result that the smart card module is protected against overvoltage.

Furthermore, the contacts for operating the semiconductor chip may also be coupling element connections formed in such a way that they form at least one spark gap arrangement among one another.

In the case of contactless smart cards, the smart card modules are connected to coupling elements via which the smart card module is supplied with energy and which are used for data exchange with a read/write unit. Antennas and capacitive coupling elements shall be mentioned as an example.

The spark gap arrangement may be formed between the antenna connections. Instead of being formed between the antenna connections, the spark gap arrangements may also be formed between antenna parts.

The use of a smart card module protected against overvoltages by spark gap arrangements in smart cards is furthermore provided.

A method for protecting a smart card module against overvoltages is furthermore specified as well, wherein the smart card module comprises a semiconductor chip, a carrier and contacts, the semiconductor chip is fixed on the carrier and the contacts serve for operating the semiconductor chip, wherein at least one spark gap arrangement is provided between the contacts of the smart card module, the at least one spark gap arrangement protecting the semiconductor chip against overvoltages.

What is claimed is:

1. A smart card module, comprising:
a smart card body;
a semiconductor chip having chip connection areas;
a carrier arrangement comprising:
a carrier having a chip side on which the semiconductor chip is fixed;
contacts configured to at least partly connect electrically with the chip connection areas of the semiconductor chip; and
at least one overvoltage protection in a form of a spark gap arrangement formed between the contacts,
wherein the contacts are formed as contact areas, and the carrier arrangement can be connected to a read/write unit, wherein the spark gap arrangement is formed between the contact areas,
wherein the carrier comprises plated-through holes and a contact area side, which is opposite the chip side, and the contact areas are formed on the contact area side, and
conductor structures, which are located on the chip side, have an electrical connection to the contact areas via the plated-through holes, and have an electrical connection to the chip connection areas of the semiconductor chip, wherein the conductor structures are formed such they form another spark gap arrangement.

2. The smart card module according to claim 1, wherein the semiconductor chip is fixed on the chip side of the carrier by an adhesive and the spark gap arrangement is embodied in a region free of the adhesive.

3. The smart card module according to claim 1, wherein the carrier has spark gap elements, which in each case have an electrical connection to a contact area or a conductor structure and form another spark gap arrangement between a respective contact area and a respective conductor structure.

4. The smart card module according to claim 1, wherein the contacts for operating the semiconductor chip are formed as coupling element connections that form the spark gap arrangement.

5. The smart card module according to claim 4, wherein the coupling element connections are antenna connections.

6. A smart card module, comprising:
a smart card body;
a semiconductor chip having chip connection areas;
a carrier arrangement comprising:
a carrier having a chip side on which the semiconductor chip is fixed;
contacts configured to at least partly connect electrically with the chip connection areas of the semiconductor chip; and
at least one overvoltage protection in a form of a spark gap arrangement formed between the contacts,
wherein the contacts are formed as contact areas, and the carrier arrangement can be connected to a read/write unit, wherein the spark gap arrangement is formed between the contact areas,
wherein the carrier comprises plated-through holes and a contact area side, which is opposite the chip side, and the contact areas are formed on the contact area side,
wherein at least two of the plated-through holes are shaped such that they form the spark gap arrangement; and
conductor structures, which are located on the chip side, have an electrical connection to the contact areas via the plated-through holes, and have an electrical connection to the chip connection areas of the semiconductor chip.

7. The smart card module according to claim 6, wherein the at least two plated-through holes are inclined towards one another such that regions having high electric field strengths are directly opposite one another.

8. The smart card module according to claim 6, wherein the spark gap arrangement is embodied in a spark gap cavity.

9. The smart card module according to claim 8, wherein an ionized discharge medium is located in the spark gap cavity.

10. A smart card module, comprising:
a smart card body;
a semiconductor chip having chip connection areas, and
a carrier arrangement comprising:
a carrier having a chip side on which the semiconductor chip is fixed;
contacts configured to at least partly connect electrically with the chip connection areas of the semiconductor chip; and
at least one overvoltage protection in a form of a spark gap arrangement formed between the contacts,
wherein the contacts are formed as contact areas, and the carrier arrangement can be connected to a read/write unit, wherein the spark gap arrangement is formed between the contact areas,
wherein the carrier comprises plated-through holes and a contact area side, which is opposite the chip side, and the contact areas are formed on the contact area side; and
conductor structures, which are located on the chip side, have an electrical connection to the contact areas via the plated-through holes, and have an electrical connection to the chip connection areas of the semiconductor chip, wherein the spark gap arrangement has spark gap elements connected to respective ones of the contact areas and of the conductor structures.

11. The smart card module according to claim 10, wherein a spark discharge of the spark gap arrangement takes place in a vertical direction.

12. A smart card module comprising:
a carrier arrangement comprising:
a carrier having a chip side and a contact area side;
contact areas arranged on the contact area side; and
at least two plated-through holes; and
a semiconductor chip fixed on the chip side of the carrier and having chip connection contacts electrically connected to the contact areas via the at least two plated-through holes;
wherein the at least two plated-through holes are formed by spark gap arrangements.

13. The carrier arrangement according to claim 12, wherein the contact areas form a spark gap arrangement, and this spark gap arrangement has a spark gap covering.

14. The carrier arrangement according to claim 12, wherein the contact areas are formed such that portions of the contact areas are spark gap arrangements.

15. The carrier arrangement according to claim 14, wherein the spark gap arrangements have spark gap elements which are electrically connected to the contact areas.

16. The carrier arrangement according to claim 15, wherein the spark gap elements are thinner than the contact areas, and the spark gap arrangements are covered in the region of the spark gap elements.

17. The carrier arrangement according to claim 12, wherein the spark gap arrangements are embodied in spark gap cavities.

18. The carrier arrangement according to claim 17, wherein the spark gap cavities contain an ionized discharge medium.

19. A smart card module comprising:
a semiconductor chip; and
a chip carrier arrangement comprising:
a carrier having the semiconductor chip fixed on a first side;
contacts and conductor structures, which are located on the carrier, at least partly electrically connected to the semiconductor chip; and
at least two plated-through holes connecting the first side and an opposite side of the carrier, and forming inside the carrier a spark gap arrangement means for protecting the semiconductor chip against overvoltages, wherein each plated-through hole is configured to be connected to at least one of the contacts or at least one of the conductor structures.

20. The smart card module according to claim 19, wherein the semiconductor chip is operated by chip connection areas, and wherein the chip connection areas and/or the conductor structures form another spark gap arrangement.

21. The smart card module according to claim 20, wherein the spark gap arrangement comprises spark gap coverings and/or spark gap cavities inside the carrier, and wherein the spark gap cavities are filled with air and/or an ionizable discharge medium.

22. The smart card module according to claim 21, wherein the conductor structures are configured to be antenna connections.

\* \* \* \* \*